(12) United States Patent
Nakata et al.

(10) Patent No.: US 10,896,863 B2
(45) Date of Patent: Jan. 19, 2021

(54) SEMICONDUCTOR DEVICE AND METHOD FOR MANUFACTURING THE SAME

(71) Applicant: Mitsubishi Electric Corporation, Tokyo (JP)

(72) Inventors: Yosuke Nakata, Tokyo (JP); Shinya Akao, Tokyo (JP); Kenji Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/349,149

(22) PCT Filed: Jan. 13, 2017

(86) PCT No.: PCT/JP2017/001079
§ 371 (c)(1),
(2) Date: May 10, 2019

(87) PCT Pub. No.: WO2018/131144
PCT Pub. Date: Jul. 19, 2018

(65) Prior Publication Data
US 2019/0326193 A1    Oct. 24, 2019

(51) Int. Cl.
*H01L 23/367*    (2006.01)
*H01L 21/02*    (2006.01)
(Continued)

(52) U.S. Cl.
CPC ...... *H01L 23/3675* (2013.01); *H01L 21/0217* (2013.01); *H01L 21/0272* (2013.01);
(Continued)

(58) Field of Classification Search
CPC ............ H01L 23/3675; H01L 21/0217; H01L 21/0272; H01L 21/31111; H01L 21/32139;
(Continued)

(56) References Cited

U.S. PATENT DOCUMENTS 5,923,072 A * 7/1999 Wada ................ H01L 21/28581
257/192
8,921,948 B2 * 12/2014 Yamazaki ........... H01L 29/7869
257/401
(Continued)

FOREIGN PATENT DOCUMENTS

JP    2003-092406 A    3/2003
JP    2007-005368 A    1/2007
(Continued)

OTHER PUBLICATIONS

International Search Report; Written Opinion; and Notification of Transmittal of the International Search Report and the Written Opinion of the International Searching Authority, or the Declaration issued in PCT/JP2017/001079; dated Apr. 4, 2017.
(Continued)

*Primary Examiner* — Alexander O Williams
(74) *Attorney, Agent, or Firm* — Studebaker & Brackett PC

(57) ABSTRACT

A semiconductor substrate (1) has a front surface and a rear surface facing each other. A gate wiring (2) and first and second front surface electrodes (3,4) are provided on the front surface of the semiconductor substrate (1). The first and second front surface electrodes (3,4) are separated from each other by the gate wiring (2). An insulating film (7) covers the gate wiring (2). An electrode layer (8) is provided on the insulating film (7) and the first and second front surface electrodes (3,4) across the gate wiring (2). A rear surface electrode (9) is provided on the rear surface of the semiconductor substrate (1). A first plated electrode (10) is provided on the electrode layer (8). A second plated electrode (11) is provided on the rear surface electrode (9).

22 Claims, 4 Drawing Sheets

(51) Int. Cl.
  H01L 21/027      (2006.01)
  H01L 21/311      (2006.01)
  H01L 21/3213     (2006.01)
  H01L 23/31       (2006.01)
  H01L 23/495      (2006.01)
  H01L 23/00       (2006.01)
  H01L 29/06       (2006.01)
  H01L 29/40       (2006.01)
  H01L 29/417      (2006.01)
  H01L 29/45       (2006.01)

(52) U.S. Cl.
  CPC .. *H01L 21/31111* (2013.01); *H01L 21/32139* (2013.01); *H01L 23/3121* (2013.01); *H01L 23/49513* (2013.01); *H01L 23/49541* (2013.01); *H01L 24/03* (2013.01); *H01L 24/05* (2013.01); *H01L 24/29* (2013.01); *H01L 24/32* (2013.01); *H01L 24/33* (2013.01); *H01L 24/83* (2013.01); *H01L 29/0619* (2013.01); *H01L 29/401* (2013.01); *H01L 29/41741* (2013.01); *H01L 29/45* (2013.01); H01L 2224/0346 (2013.01); H01L 2224/05644 (2013.01); H01L 2224/05647 (2013.01); H01L 2224/05655 (2013.01); H01L 2224/29111 (2013.01); H01L 2224/29139 (2013.01); H01L 2224/32245 (2013.01); H01L 2224/33181 (2013.01); H01L 2224/8384 (2013.01); H01L 2924/05042 (2013.01); H01L 2924/07025 (2013.01); H01L 2924/1033 (2013.01); H01L 2924/10254 (2013.01); H01L 2924/10272 (2013.01); H01L 2924/13055 (2013.01); H01L 2924/13091 (2013.01); H01L 2924/302 (2013.01); H01L 2924/3511 (2013.01)

(58) Field of Classification Search
  CPC ........... H01L 23/3121; H01L 23/49513; H01L 23/49541; H01L 24/03; H01L 24/05; H01L 24/29; H01L 24/32; H01L 24/33; H01L 24/83; H01L 29/0619; H01L 29/401; H01L 29/41741; H01L 29/45; H01L 23/367; H01L 21/02; H01L 21/027; H01L 21/311; H01L 21/3213; H01L 23/31; H01L 23/495; H01L 23/00; H01L 29/06; H01L 29/40; H01L 29/417; H01L 2224/0346; H01L 2224/05644; H01L 2224/05655; H01L 2224/29111; H01L 2224/29139; H01L 2224/32245; H01L 2224/33181; H01L 2224/8384; H01L 2924/05042; H01L 2924/07025; H01L 2924/10254; H01L 2924/10272; H01L 2924/1033; H01L 2924/23055; H01L 2924/302; H01L 2924/3511

USPC .......................................................... 257/76
  See application file for complete search history.

(56) References Cited

U.S. PATENT DOCUMENTS

| | | | |
|---|---|---|---|
| 2010/0025820 A1 | 2/2010 | Suekawa | |
| 2012/0153349 A1 | 6/2012 | Suzuki | |
| 2014/0159230 A1 | 6/2014 | Kadoguchi | |
| 2015/0053954 A1* | 2/2015 | Akiyama | H01L 51/107 257/40 |
| 2016/0254761 A1* | 9/2016 | Furukawa | H01L 21/78 363/131 |
| 2017/0111037 A1* | 4/2017 | Shiigi | H01L 24/06 |
| 2017/0207180 A1* | 7/2017 | Arai | H01L 23/562 |
| 2019/0326193 A1* | 10/2019 | Nakata | H01L 29/41741 |
| 2020/0075529 A1* | 3/2020 | Otsuka | H01L 23/4334 |
| 2020/0126925 A1* | 4/2020 | Michiaki | H01L 23/4924 |

FOREIGN PATENT DOCUMENTS

| | | | | |
|---|---|---|---|---|
| JP | 2010-034306 A | * | 2/2010 | ............ H01L 29/78 |
| JP | 2011-219828 A | * | 11/2011 | ............ C23C 18/16 |
| JP | 2012-134189 A | * | 7/2012 | ............ H01L 29/78 |
| JP | 2012-134198 A | | 7/2012 | |
| JP | 2014-116473 A | | 6/2014 | |
| JP | 2015-015395 A | * | 1/2015 | ............ H01L 21/60 |

OTHER PUBLICATIONS

An Office Action mailed by the Japanese Patent Office dated Mar. 3, 2020, which corresponds to Japanese Patent Application No. 2018-561757 and is related to U.S. Appl. No. 16/349,149.

Office Action mailed by the Japanese Patent Office on Sep. 15, 2020, which corresponds to Japanese Patent Application No. 2018-561757 and is related to U.S. Appl. No. 16/349,149.

* cited by examiner

SEMICONDUCTOR DEVICE AND METHOD FOR MANUFACTURING THE SAME

FIELD

The present invention relates to a semiconductor device and a method for manufacturing the same.

BACKGROUND

A method for manufacturing a semiconductor device in which electrodes are simultaneously formed on both surfaces of a semiconductor substrate by a plating method has been disclosed (see, for example, PTL 1). Further, in order to realize uniform operation, an electrode on the front surface of a semiconductor substrate is divided into comb teeth shape by a gate wiring (see, for example, PTL 2). Meanwhile, an electrode on the rear surface of a semiconductor substrate generally has the same shape as the semiconductor substrate.

CITATION LIST

Patent Literature

[PTL 1] Japanese Patent Application Publication No. 2007-5368
[PTL 2] Japanese Patent Application Publication No. 2003-92406

SUMMARY

Technical Problem

In the conventional semiconductor device, the shape of the electrode on the front surface is different from that on the rear surface of the semiconductor substrate. Therefore, when plated electrodes of the same quality are formed on both sides of the semiconductor substrate by a wet plating method, a difference in film stress occurs between the plated electrodes of the front surface and the rear surface. The resulting problem is that the semiconductor substrate warps convexly to the front surface side, the yield at the time of assembling the semiconductor device is lowered, and thermal resistance after assembling is uneven.

The present invention has been accomplished to resolve the above-described problem, and it is an object of the present invention to provide a semiconductor device making it possible to improve the yield at the time of assembling and the uniformity of thermal resistance after assembling and also to provide a method for manufacturing the semiconductor device.

Solution to Problem

A semiconductor device according to the present invention includes: a semiconductor substrate having a front surface and a rear surface facing each other; a gate wiring provided on the front surface of the semiconductor substrate; first and second front surface electrodes provided on the front surface of the semiconductor substrate and separated from each other by the gate wiring; an insulating film covering the gate wiring; an electrode layer provided on the insulating film and the first and second front surface electrodes across the gate wiring; a rear surface electrode provided on the rear surface of the semiconductor substrate; a first plated electrode provided on the electrode layer; and a second plated electrode provided on the rear surface electrode.

Advantageous Effects of Invention

In the present invention, the electrode layer is provided on the first and second front surface electrodes separated from each other by the gate wiring, and the first and second plated electrodes are formed on the electrode layer and the rear surface electrode respectively. As a result, the shapes of the electrodes on both sides of the semiconductor substrate are brought close to each other, so that the difference in film stress between the electrodes on both surfaces is reduced, and warping of the semiconductor substrate is reduced. It is thus possible to improve the yield at the time of assembling the semiconductor device and the uniformity of thermal resistance after assembling.

DESCRIPTION OF EMBODIMENTS

A semiconductor device and a method for manufacturing the same according to the embodiments of the present invention will be described with reference to the drawings. The same components will be denoted by the same symbols, and the repeated description thereof may be omitted.

Embodiment 1

Figure 1:
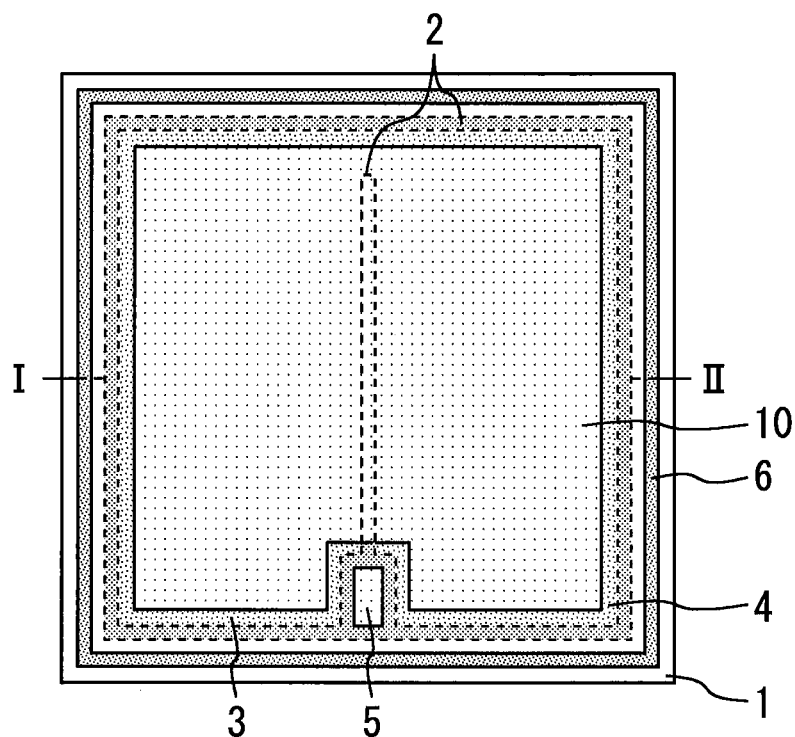
FIG. 1 is a plan view showing a semiconductor device according to Embodiment 1 of the present invention.
Figure 2:
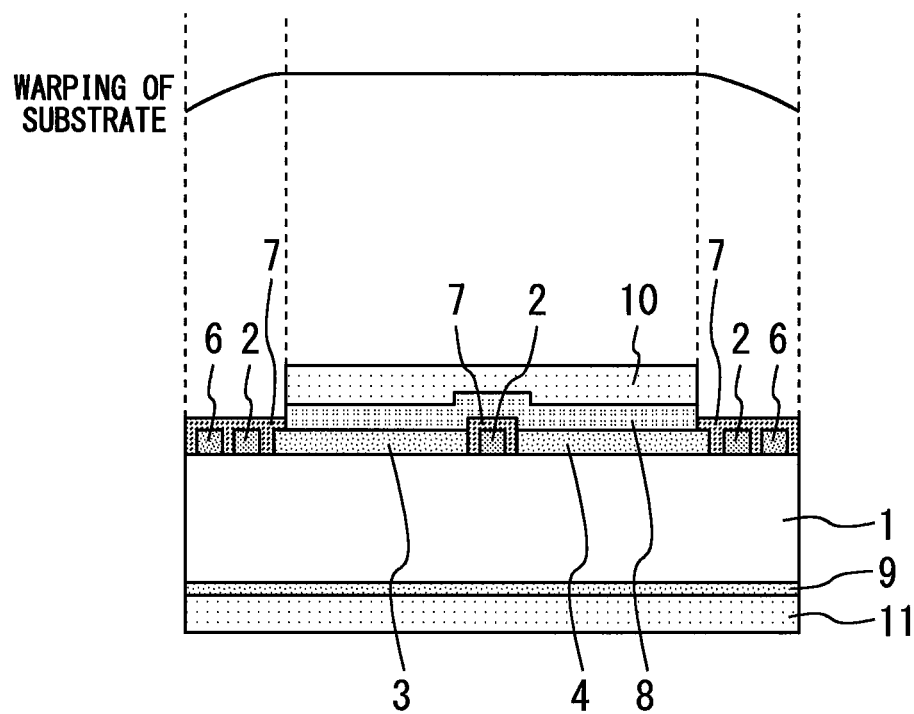
FIG. 2 is a cross-sectional view taken along line I-II in FIG. 1.

FIG. 1 is a plan view showing a semiconductor device according to Embodiment 1 of the present invention. FIG. 2 is a cross-sectional view taken along line I-II in FIG. 1. This semiconductor device is a power semiconductor device such as an IGBT or a MOSFET.

A semiconductor substrate 1 has a front surface and a rear surface facing each other. A gate wiring 2 and front surface electrodes 3, 4 are formed on the front surface of the semiconductor substrate 1. In order to uniformly operate the semiconductor device, the surface electrodes 3, 4 are separated from each other and partially connected by the gate wiring 2. The gate wiring 2 has a pad 5 for contact with a control wire.

In order to maintain the breakdown voltage of the semiconductor device, a plurality of terminal structure wirings 6 is formed in the terminal region of the semiconductor substrate 1. The terminal structure wiring 6 is, for example, a breakdown voltage maintaining structure such as a guard ring and is composed of a plurality of wirings. The gate wiring 2, the front surface electrodes 3, 4, and the terminal structure wirings 6 are uniformly formed, for example, by a vapor phase deposition method such as sputtering with an aluminum-based material, and divided and patterned into a desired shape by a photolithography process and an etching process.

An insulating film 7 covers the gate wiring 2. The insulating film 7 can be formed using, for example, a silicon nitride film as a main material. For example, the insulating film 7 is obtained by depositing a silicon nitride film and then patterning into a desired shape through a photolithography process and an etching process. An electrode layer 8 is formed on the insulating film 7 and the front surface electrodes 3, 4 across the gate wiring 2.

A rear surface electrode 9 is formed on the rear surface of the semiconductor substrate 1. The rear surface electrode 9 has the same dimensions as the outer shape of the semiconductor substrate 1. A plated electrode 10 is formed on the electrode layer 8, and a plated electrode 11 is formed on the rear surface electrode 9. The thickness and the material of the plated electrodes 10, 11 are the same.

Figure 3:
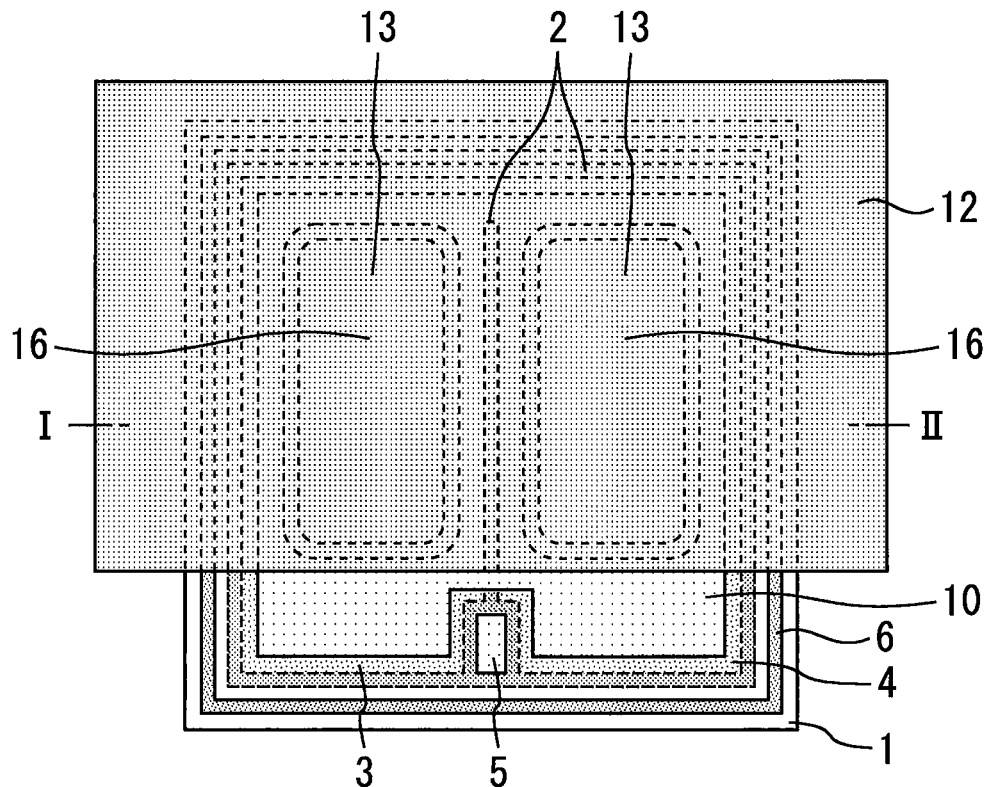
FIG. 3 is a plan view showing a semiconductor package using the semiconductor device according to Embodiment 1 of the present invention.
Figure 4:
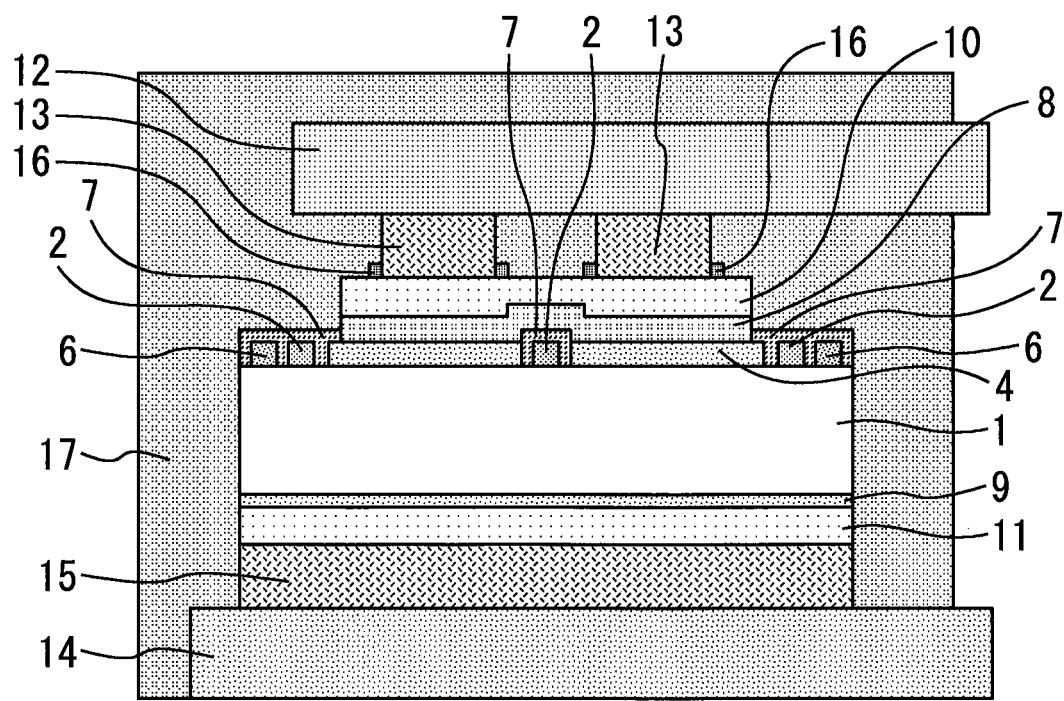
FIG. 4 is a cross-sectional view taken along line I-II in FIG. 3.

FIG. 3 is a plan view showing a semiconductor package using the semiconductor device according to Embodiment 1 of the present invention. FIG. 4 is a cross-sectional view taken along line I-II in FIG. 3. A lead frame 12 is joined and electrically and mechanically connected to the plated electrode 10 by a joining material 13. A conductor substrate 14 is joined and electrically and mechanically connected to the plated electrode 11 by a joining material 15. The joining materials 13, 15 are, for example, a solder made of a tin-based material, and joining thereby can be easily performed. The pad 5 and an external signal terminal are connected by, for example, a wire made of an aluminum-based material.

The joining material 13 is formed in a region other than the gate wiring 2. Therefore, stress from the joining material 13 can be prevented from being applied to the gate wiring 2 during a cooling/heating cycle, so that it is possible to prevent the gate wiring 2 from being damaged and short-circuited with a peripheral electrode. Meanwhile, in order to make the joining material 15 on the rear surface of the semiconductor substrate 1 as large as possible, the joining material is formed in the same shape as the semiconductor substrate 1. As a result, heat generated from the semiconductor device can be efficiently radiated to the conductor substrate 14.

A coating film 16 covers the outer periphery of the solder joining region of the plated electrode 10. Therefore, it is possible to prevent the solder from wetting and spreading more than expected on the upper surface of the plated electrode 10. As a result, short-circuiting with other members can be prevented, and the yield and reliability can be improved. As long as the coating film 16 is a material including a polyimide, it is possible to reliably inhibit solder wetting. The coating film 16 can be formed by drawing and coating a polyimide precursor solution in a desired shape on the plated electrode 10 and then curing the precursor solution.

A sealing material 17 covers at least a part of the semiconductor substrate 1, the joining materials 13, 15, the lead frame 12, the conductor substrate 14, and the like. As a result, it is possible to reduce electrical loss and to realize a highly reliable semiconductor device. The sealing material 17 is, for example, a potting resin or a transfer molding resin.

A method for manufacturing the semiconductor device according to the present embodiment will be described hereinbelow. The gate wiring 2 and the surface electrodes 3 and 4 separated from each other by the gate wiring 2 are formed on the surface of the semiconductor substrate 1. The insulating film 7 covering the gate wiring 2 is formed. The electrode layer 8 is formed on the insulating film 7 and the surface electrodes 3, 4 across the gate wiring 2. The rear surface electrode 9 is formed on the rear surface of the semiconductor substrate 1.

A wet plating method is then used to form the plated electrode 10 on the electrode layer 8, the pad 5 in a portion where the gate wiring 2 is opened, and the plated electrode 11 on the rear surface electrode 9. By simultaneously forming the aforementioned components, the process cost of the plating process can be suppressed. Further, to enable simultaneous formation, the thickness and the material of the plated electrodes 10, 11 and the pad 5 are the same.

The plated electrodes 10, 11 and the pad 5 are made of, for example, a nickel-based material and can be formed by a process using zincate treatment. Since it is desirable that the plated electrodes 10, 11 remain even after the solder joining, the thickness of the plated electrodes 10, 11 is desirably 1 μm or more. In order to suppress the increase in the process cost of the plating process and ensure the yield of the dicing process, the thickness of the plated electrodes 10, 11 is desirably 10 μm or less.

The electrode layer 8 can be made of, for example, an aluminum-based material. In the case where the gate wiring 2 and the electrode layer 8 are made of the same material such as aluminum, in order to prevent the pad 5 of the gate wiring 2 from being etched, it is desirable to pattern the electrode layer 8 by a process other than etching of aluminum. For example, the electrode layer 8 is patterned by a lift-off method in which the electrode layer 8 is vapor-phase deposited by a sputtering method or the like through an organic resist film having an opening in an electrode layer formation region, and then a stripping liquid for dissolving the organic resist is blown, thereby selectively removing only the electrode layer 8 on the organic resist. Alternatively, the electrode layer 8 may be patterned by vapor-phase depositing, by a sputtering method or the like, the electrode layer 8 through a mask having an opening in the electrode layer formation region. As a result, patterning can be performed easily, and damage to the front surface electrodes 3, 4 can be reduced.

Further, a polyimide precursor solution is discharged and drawn on the plated electrode 10 to form a pattern, and the pattern is cured to form the coating film 16. The coating film 16 can thus be easily patterned without photolithography.

Figure 5:
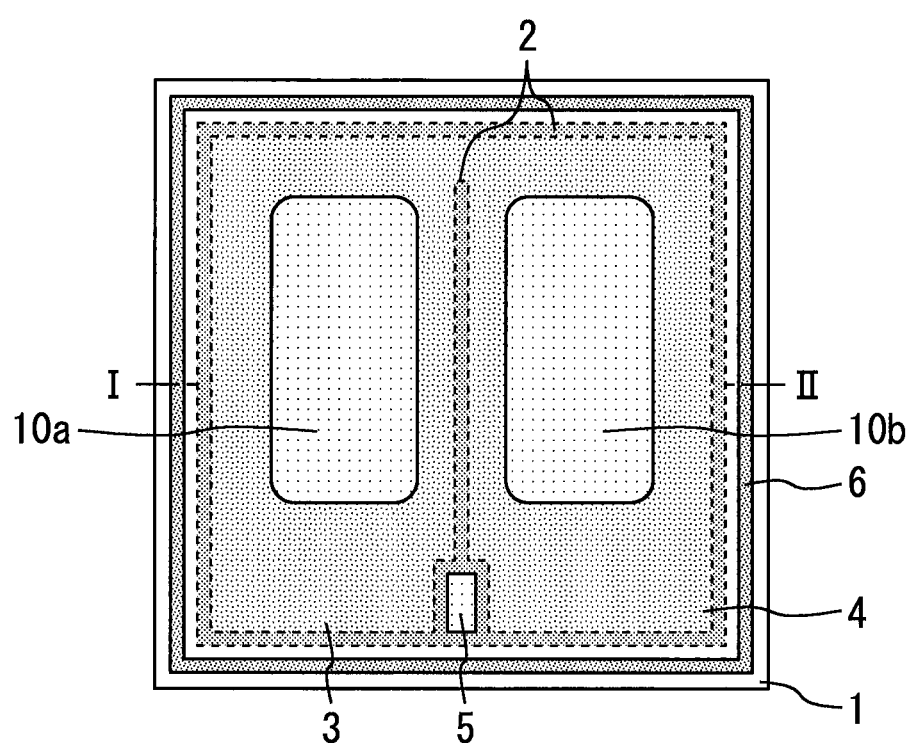
FIG. 5 is a plan view showing a semiconductor device according to a comparative example.
Figure 6:
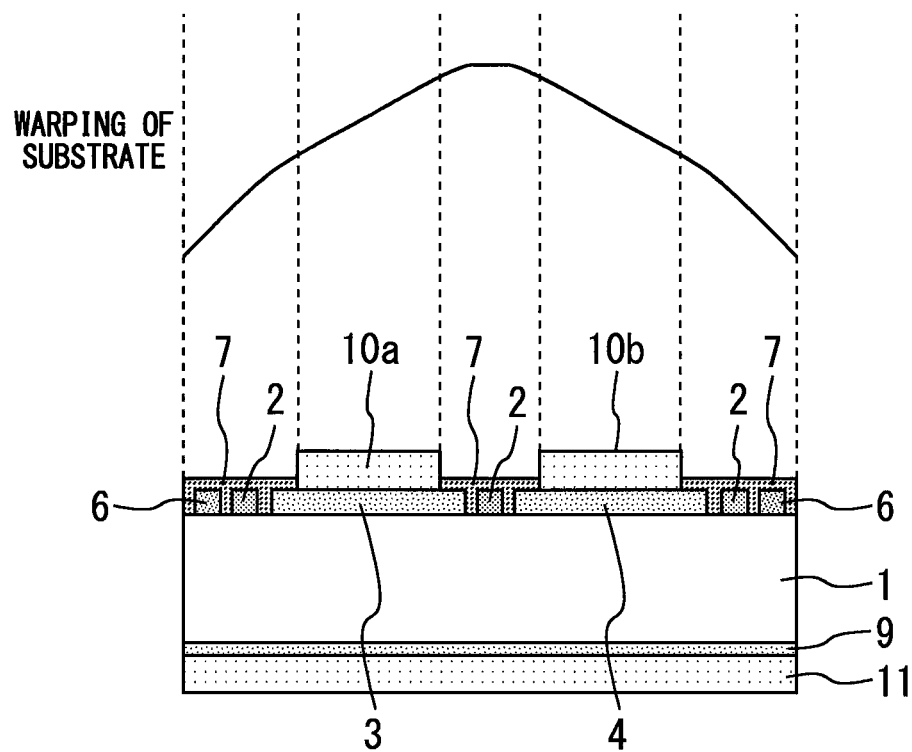
FIG. 6 is a cross-sectional view taken along line I-II in FIG. 5.

Subsequently, the effect of the present embodiment will be described in comparison with a comparative example. FIG. 5 is a plan view showing a semiconductor device according to a comparative example. FIG. 6 is a cross-sectional view taken along line I-II in FIG. 5. In the comparative example, the plated electrodes 10a, 10b on the front surface of the semiconductor substrate 1 are different in shape from the plated electrode 11 on the rear surface. The resulting problem is that the semiconductor substrate 1 warps convexly to the front surface side, the yield at the time of assembling the semiconductor device is lowered, and thermal resistance after assembling is uneven.

Meanwhile, in the present embodiment, the electrode layer 8 is formed on the front surface electrodes 3, 4 separated from each other by the gate wiring 2, and the plated electrodes 10, 11 are formed on the electrode layer 8 and the rear surface electrode 9, respectively. As a result, the shapes of the electrodes on both sides of the semiconductor substrate 1 are brought close to each other, so that the difference in film stress between the electrodes on both surfaces is reduced, and warping of the semiconductor substrate is reduced. It is thus possible to improve the yield at the time of assembling the semiconductor device and the uniformity of thermal resistance after assembling.

The terminal structure wiring 6 is formed in the same process as the front surface electrodes 3, 4 and is patterned by a processing process such as etching. As a result, the terminal structure wiring 6 has the same thickness as the front surface electrodes 3, 4. Therefore, when the front surface electrodes 3, 4 are thickened, the terminal structure wiring 6 is also thickened. When the terminal structure wiring 6 becomes thick, the stress received from the sealing material or the like becomes large, so that the reliability is lowered. Therefore, by not forming the electrode layer 8 in the terminal region, it is possible to avoid making the terminal structure wiring 6 thicker than necessary.

In addition, since the terminal structure wiring 6 performs electric field sharing and does not conduct a large current, it is not necessary to increase the film thickness to lower the resistance value. Meanwhile, it is desirable to make the front surface electrodes 3, 4 as thick as possible in order to adapt the electrodes to energization of a large current and to alleviate the stress generated by expansion and contraction of the solder. According to the present embodiment, it is possible to increase the thickness of the electrode while suppressing the thickness of the terminal structure wiring 6, so that a semiconductor device with higher reliability can be formed. In an exemplary design, the thickness of the front surface electrodes 3, 4 and the terminal structure wiring 6 is 1.5 μm or less and the total thickness of the front surface electrodes 3, 4 and the electrode layer 8 is 3 μm or more.

The insulating film 7 is also provided between the front surface electrodes 3, 4 and the electrode layer 8. Therefore, even when the semiconductor device receives a stress from the outside, it is possible to prevent damage such as wiring cracks from reaching the front surface electrodes 3, 4.

A plurality of through holes are provided in the insulating film 7, and the front surface electrodes 3, 4 and the electrode layer 8 are mechanically and electrically connected through the plurality of through holes. Meanwhile, an opening is provided in the insulating film 7 on the pad 5 of the gate wiring 2. The other portion of the gate wiring 2 is covered with the insulating film 7, and the insulating property between the gate wiring 2 and the front surface electrodes 3, 4 is secured.

The insulating film 7 covers the plurality of terminal structure wirings 6 to equalize the electric field distribution between the plurality of terminal structure wirings 6. That is, the insulating film 7 is a protective film that protects the terminal region and extends to the operating cell region. By making the insulating film 7 and the protective film in this way, it is possible to form the insulating film 7 without an additional processing process.

The thicknesses of the front surface electrodes 3, 4 and the terminal structure wiring 6 are less than the thickness of the electrode layer 8. As a result, it is possible to secure the electrode thickness on the operation cell contributing to the solder joining property and the wire bonding property while securing the reliability of the terminal structure, and it is possible to improve the reliability and productivity.

The front surface electrodes 3, 4 and the rear surface electrode 9 are made of a material including aluminum. Therefore, such material can be easily formed and processed as an electrode of a semiconductor device, the electrical resistance at the time of energization is also low, and a mechanically stable joint interface can be formed.

The electrode layer 8 is made of a material including aluminum. Therefore, the plated electrode 10 can be easily formed, the electric resistance at the time of energization is also low, and a mechanically stable joint interface can be obtained with the front surface electrodes 3, 4 made of a material including aluminum. Further, since the material is the same as that of the rear surface electrode 9, the plated electrodes 10, 11 can be easily formed by a wet plating method. Further, the insulating film 7 includes silicon nitride. Since silicon nitride functions as a protective film and also has good compatibility with aluminum of the front surface electrodes 3, 4, a structure that is electrically and mechanically stable can be obtained.

Since the plated electrodes 10, 11 include nickel or copper, the plated electrodes can be easily joined to the solder and form an electrically and mechanically stable joint interface. It is also desirable that a material including gold be formed on the outermost surfaces of the plated electrodes 10, 11. As a result, it is possible to prevent the underlying solder joining electrode from being oxidized and the solder wettability from deteriorating before joining with the solder.

Further, the conductor substrate 14 may be joined to the plated electrode 11 by sintering fine particles of an Ag-based material. When joining by sintering fine particles composed of an Ag-based material, joining is generally performed by pressurizing the semiconductor substrate 1. However, the semiconductor substrate 1 may be damaged by stress generated when the semiconductor substrate 1 is bent by external pressure or due to friction with the external jig. By contrast, in this embodiment, warp of the semiconductor substrate 1 can be eliminated. Therefore, damage occurring in the semiconductor substrate 1 at the time of pressurization can be reduced.

Embodiment 2

Figure 7:
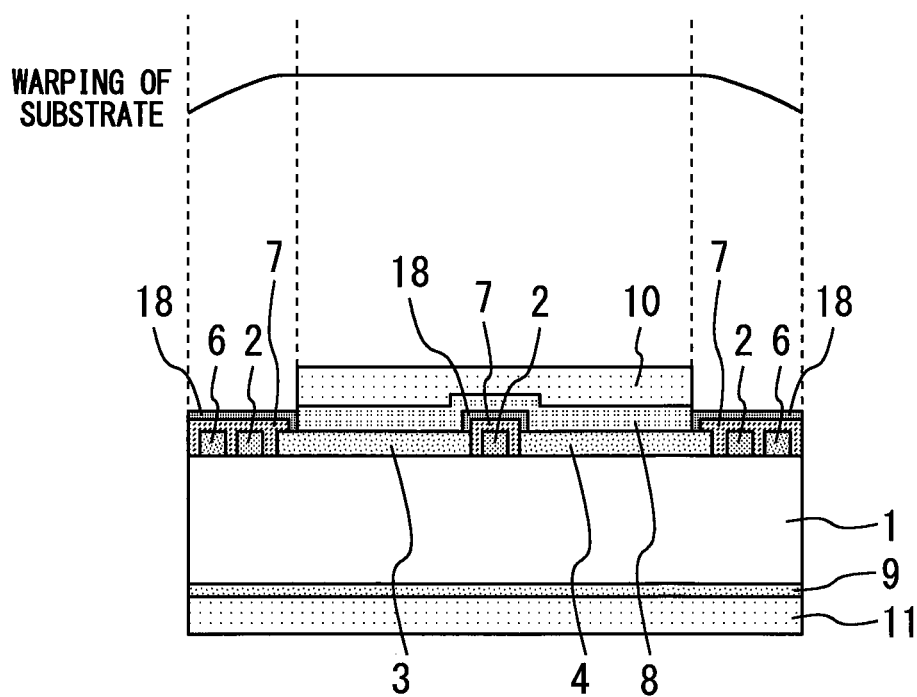
FIG. 7 is a cross-sectional view showing a semiconductor device according to Embodiment 2 of the present invention.

FIG. 7 is a cross-sectional view showing a semiconductor device according to Embodiment 2 of the present invention. An organic film 18 is formed on the insulating film 7. As a result, it is possible to prevent the gate wiring 2 from short-circuiting with the front surface electrodes 3, 4 or the electrode layer 8 due to the stress during a cooling and heating cycle.

It is desirable that the organic film 18 have the same shape as the insulating film 7 and overlap the insulating film 7. Considering halation and overlay accuracy at the time of photolithography, it is desirable to secure an overlap amount of 10 μm or more. Further, where the organic film 18 includes a polyimide, it can be easily formed and processed as an insulating film of a semiconductor device.

The semiconductor substrate 1 is not limited to a substrate made of silicon, but instead may be made of a wide-bandgap semiconductor having a bandgap wider than that of silicon. The wide-bandgap semiconductor is, for example, a silicon carbide, a gallium-nitride-based material, or diamond. A semiconductor device made of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 1 semiconductor substrate; 2 gate wiring; 3,4 front surface electrode; 5 pad; 6 terminal structure wiring; 7 insulating film; 8 electrode layer; 9 rear surface electrode; 10,11 plated electrode; 12 lead frame; 13,15 joining material; 14 conductor substrate; 16 coating film; 17 sealing material; 18 organic film

The invention claimed is:

1. A semiconductor device comprising:
   a semiconductor substrate having a front surface and a rear surface facing each other;
   a gate wiring provided on the front surface of the semiconductor substrate;
   first and second front surface electrodes provided on the front surface of the semiconductor substrate and separated from each other by the gate wiring;
   an insulating film covering the gate wiring;
   an electrode layer provided on the insulating film and the first and second front surface electrodes across the gate wiring;
   a rear surface electrode provided on the rear surface of the semiconductor substrate;
   a first plated electrode provided on the electrode layer; and
   a second plated electrode provided on the rear surface electrode.

2. The semiconductor device according to claim 1, wherein thicknesses and materials of the first and second plated electrodes are the same.

3. The semiconductor device according to claim 1, wherein thicknesses of the first and second plated electrodes are 1 μm or more and 10 μm or less.

4. The semiconductor device according to claim 1, wherein the insulating film is provided between the first and second front surface electrodes and the electrode layer,
   a plurality of through holes are provided in the insulating film, and
   the first and second front surface electrodes are mechanically and electrically connected to the electrode layer through the plurality of through holes.

5. The semiconductor device according to claim 1, wherein the insulating film is a protective film that protects a terminal region and extends to an operating cell region.

6. The semiconductor device according to claim 1, comprising a terminal structure wiring provided on the front surface of the semiconductor substrate in a terminal region and having the same thickness as the first and second front surface electrodes,
   wherein the electrode layer is not provided in the terminal region.

7. The semiconductor device according to claim 6, wherein thicknesses of the first and second front surface electrodes and the terminal structure wiring are less than a thickness of the electrode layer.

8. The semiconductor device according to claim 1, further comprising:
   a lead frame joined to the first plated electrode by a first joining material;
   a conductor substrate joined to the second plated electrode by a second joining material; and
   a sealing material covering at least a part of the semiconductor substrate, the lead frame, the conductor substrate.

9. The semiconductor device according to claim 8, wherein the first joining material is provided in a region other than the gate wiring.

10. The semiconductor device according to claim 8, wherein the first and second joining materials include tin.

11. The semiconductor device according to claim 1, comprising a coating film covering an outer periphery of a solder joining region of the first plated electrode.

12. The semiconductor device according to claim 11, wherein the coating film includes a polyimide.

13. The semiconductor device according to claim 1, further comprising an organic film provided on the insulating film.

14. The semiconductor device according to claim 13, wherein the organic film includes a polyimide.

15. The semiconductor device according to claim 1, wherein the first and second front surface electrodes and the rear surface electrode are made of a material including aluminum.

16. The semiconductor device according to claim 1, wherein the electrode layer is made of a material including aluminum.

17. The semiconductor device according to claim 1, wherein the insulating film includes silicon nitride.

18. The semiconductor device according to claim 1, wherein the first and second plated electrodes include nickel or copper.

19. The semiconductor device according to claim 1, wherein a material including gold is provided on outermost surfaces of the first and second plated electrodes.

20. The semiconductor device according to claim 1, wherein the semiconductor substrate is made of a wide-band-gap semiconductor.

21. The semiconductor device according to claim 1, wherein
   the first plated electrode is provided continuously on the electrode layer to extend over the first front surface electrode, the insulating film and the second front surface electrode.

22. The semiconductor device according to claim 21, wherein
   the second plated electrode is provided continuously on the rear surface electrode.

* * * * *